(12) United States Patent
Tsumori et al.

(10) Patent No.: US 6,856,637 B2
(45) Date of Patent: Feb. 15, 2005

(54) OPTICAL TRANSMITTER HAVING PHOTODIODE

(75) Inventors: Masahiko Tsumori, Kyoto (JP); Haruo Tanaka, Kyoto (JP); Tomohiro Yamazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 28 days.

(21) Appl. No.: 10/247,167

(22) Filed: Sep. 19, 2002

(65) Prior Publication Data

US 2003/0063651 A1 Apr. 3, 2003

(30) Foreign Application Priority Data

Oct. 2, 2001 (JP) ........................................ 2001-306776

(51) Int. Cl.[7] .............................. H01S 3/13; H01S 3/00; H01S 5/00; H01S 3/08
(52) U.S. Cl. ..................... 372/50; 372/29.02; 372/38.1; 372/29.011; 372/43; 372/107
(58) Field of Search ............................. 372/29.02, 38.1, 372/29.011, 43, 50, 107; 250/711

(56) References Cited

U.S. PATENT DOCUMENTS

| | | | | |
|---|---|---|---|---|
| 4,771,434 A | * | 9/1988 | Yoshida et al. | ................ 372/50 |
| 6,483,098 B1 | * | 11/2002 | Kato et al. | ................ 250/214.1 |
| 2003/0075672 A1 | * | 4/2003 | Liu | ......................... 250/214.1 |

* cited by examiner

*Primary Examiner*—Paul Ip
*Assistant Examiner*—Armando Rodriguez
(74) *Attorney, Agent, or Firm*—Hedman & Costigan, P.C.

(57) ABSTRACT

An optical transmitter is equipped with a laser diode and a light detector provided on a packaging base, in which the light detector has a semiconductor substrate side arranged on a packaging base side, a semiconductor junction plane, a side surface which is roughly orthogonal to the semiconductor junction plane, and a facing surface which faces the side surface, wherein the facing surface is partially or completely inclined to reflect the output light from the laser diode incident from the side surface to the semiconductor junction plane of the light detector.

2 Claims, 22 Drawing Sheets

OPTICAL TRANSMITTER HAVING PHOTODIODE

The present application claims priority to Japanese Patent Application Serial No. 2001-306776, filed Oct. 2, 2001.

BACKGROUND OF THE INVENTION

1. Field of the Invention

The present invention is related to an optical transmitter which receives backward light of a laser diode by a monitoring light detector, and is applied particularly to optical communication or optical recording/reading.

2. Description of the Prior Art

The prior art will be described with reference to FIG. 1. FIG. 1 is rough explanatory drawing of an optical transmitter according to a prior art example. In FIG. 1, a laser diode 81 outputs light in the two directions forward and backward. Normally, the forward light 82 is used as output light to the outside of the apparatus, and the backward light 83 is used as output light for monitoring. Because the proportion of output light with respect to the input current changes due to temperature and degradation over time, the backward light is monitored and a negative feedback loop is created to control the output light of the laser diode, whereby it is possible to plan the stabilization of the output light of the optical transmitter.

In the prior art, in order to monitor the backward light of the laser diode, a substrate of a light detector 84 is designed to be transparent to the wavelength of the output light from the laser diode, and the apparatus is constructed with the light detector 84 provided on the same packaging base 86 as the laser diode 81.

However, in the example where InGaAs is used as a light detector, because InGaAs has a large refractive index of 3.56, even when the backward light 83 of the laser diode is incident on the side surface of the light detector 84 facing the laser diode 81, the light will propagate roughly parallel to the semiconductor junction plane 85 inside the light detector after being refracted by such side surface, and the proportion of such backward light 83 absorbed by the depletion layer of the light detector 84 was small. Even when the backward light 83 from the laser diode 81 is reflected by the surface facing such side surface, because the light will propagate roughly parallel to the semiconductor junction plane 85, the proportion of such backward light 83 absorbed by the depletion layer of the light detector 84 is still small.

Further, even though it is possible to consider a method in which the angle formed between the side surface where the backward light of the laser diode is incident and the junction plane of the light detector is made an acute angle so that the backward light 83 from the laser diode 81 is sent to the semiconductor junction plane 85 after being incident from such side surface, because the refractive index of light at the boundary from air to the light detector is used, such side surface needs to have a large inclination angle.

Furthermore, because the light detector 84 excluding the depletion layer is made transparent to the output light from the laser diode, when stray light 87 inside the optical transmitter is incident on the light detector 84 and absorbed by the depletion layer 85, this causes outside interference with the negative feedback loop, and there is the risk that the negative feedback loop for stabilizing the output light of the laser diode will not be carried out normally.

SUMMARY OF THE INVENTION

In view of the points described above, it is an object of the present invention to provide an optical transmitter having high detection efficiency by inclining a side surface of the monitoring light detector that detects the backward light of the laser diode. Further, it is an object of the present invention to provide an optical transmitter having high detection efficiency by inclining the monitoring light detector itself that detects the backward light of the laser diode. Further, it is an object of the present invention to provide an optical transmitter having high detection efficiency by forming a reflecting film on the monitoring light detector that detects the backward light of the laser diode. Furthermore, it is an object of the present invention to provide an optical transmitter which makes it possible to create a stable negative feedback loop by preventing stray light inside the optical transmitter from entering the monitoring light detector.

In order to achieve the objects stated above, the optical transmitter according to a first embodiment of the invention is equipped with a laser diode and a light detector provided on a packaging base, in which the light detector has a semiconductor substrate side arranged on a packaging base side, a semiconductor junction plane, a side surface which is roughly orthogonal to the semiconductor junction plane, and a facing surface which faces the side surface, and wherein the facing surface is partially or completely inclined to reflect the output light from the laser diode incident from the side surface to the semiconductor junction plane of the light detector.

In the first embodiment of the invention because the monitoring light detector is provided on the same packaging base as the laser diode with the semiconductor substrate side arranged on the packaging base side, the backward light of the laser diode is incident inside the light detector from the side surface roughly orthogonal to the semiconductor junction plane of th light detector. The inside of the light detector is designed to be transparent to the wavelength of the output light from the laser diode, and in the example where InGaAs is used as a light detector, because InGaAs has a large refractive index of 3.56, the backward light from the laser diode incident on the light detector propagates inside the light detector roughly parallel to the semiconductor junction plane, and is partially reflected by the surface facing the side surface. When all or a portion of such facing surface is inclined to form an acute angle with the semiconductor junction plane, the reflected backward light is sent to the depletion layer formed on the semiconductor junction plane, and then the backward light is absorbed by the depletion layer. Further, when all or a portion of such facing surface is inclined to form an obtuse angle with the semiconductor junction plane, the reflected backward light is reflected by the bottom surface of the semiconductor substrate aide of the light detector and then absorbed by the depletion layer.

In the case where such facing surface is not inclined, because the backward light reflected by such facing surface will once again propagate roughly parallel to the semiconductor junction plane, there will be a decrease in the amount of backward light reaching the semiconductor junction plane, and this causes the proportion of backward light absorbed by the depletion layer to become small. Accordingly, compared with the case where such facing surface is not inclined, the present invention makes it possible to increase the amount of backward light absorbed by the depletion layer.

Further, because the method of inclining the surface facing the side surface where the backward light is incident in order to use reflection to send the backward light from the laser diode to the depletion layer of the light detector can use a smaller inclination angle than the method of inclining the side surface of the light detector where the backward light from the laser diode is incident in order to use the refraction of light at the boundary from air to the light detector to send the backward light from the laser diode to the depletion layer of the light detector, it is easy to manufacture the light detector.

As described above, the first embodiment of the invention makes it possible to efficiently detect the backward light of the laser diode with the monitoring light detector.

The optical transmitter according to a second embodiment of the invention is equipped with a laser diode and a light detector provided on a packaging base, in which the light detector has a semiconductor junction plane side arranged on a packaging base side, a side surface which is roughly orthogonal to the semiconductor junction plane, and a facing surface which faces the side surface, wherein the facing surface is partially or completely inclined to reflect the output light from the laser diode incident from the side surface to the semiconductor junction plane of the light detector.

In the second embodiment of the invention because the monitoring light detector is provided on the same packaging base as the laser diode with the semiconductor junction plane side arranged on the packaging base side, the backward light of the laser diode is incident inside the light detector from the side surface roughly orthogonal to the semiconductor junction plane of the light detector. Because the inside of the light detector is designed to be transparent to the wavelength of the output light from the laser diode, the backward light from the laser diode propagates inside the light detector roughly parallel to the semiconductor junction plane, and is partially reflected by the surface facing the side surface. When all or a portion of such facing surface is inclined to form an acute angle with the semiconductor junction plane, the reflected backward light is sent to the semiconductor junction plane, and then the backward light is absorbed by the depletion layer. Further, when all or a portion of such facing surface is inclined to form an obtuse angle with the semiconductor junction plane, the reflected backward light is reflected by the top surface of the semiconductor substrate side of the light detector and then absorbed by the depletion layer.

In the case where such facing surface is not inclined, because the backward light reflected by such facing surface will once again propagate roughly parallel to the semiconductor junction plane, there will be a decrease in the amount of backward light reaching the semiconductor junction plane, and this causes the proportion of backward light absorbed by the depletion layer to become small. Accordingly, compared with the case where such facing surface is not inclined, the present invention makes it possible to increase the amount of backward light absorbed by the depletion layer.

As described above, the second embodiment of the invention makes it possible to efficiently deflect the backward light of the laser diode with the monitoring light detector.

In the optical transmitter according to the first embodiment of the invention the present invention also provides that the facing surface maybe inclined so as to make the incident angle formed by the beam center line of the output light from the laser diode greater than or equal to a critical angle when the output light from the laser diode is reflected by the facing surface.

In the same way, in the optical transmitter according to the second embodiment of the invention the present invention also provides that the facing surface maybe inclined so as to make the incident angle formed by the beam center line of the output light from the laser diode greater than or equal to a critical angle when the output light from the laser diode is reflected by the facing surface.

In the invention according to the first or second embodiment of the invention, the present invention further provides that the facing surface maybe inclined so as to make the incident angle formed by the beam center line of the backward light from the laser diode greater than or equal to a critical angle when the backward light from the laser diode that is incident from the side surface roughly orthogonal to the semiconductor junction plane of the light detector is reflected by the facing surface after propagating inside the light detector. When the incident angle is established to be greater than or equal to a critical angle, the reflection by such facing surface forms a total reflection and this makes it possible to prevent a decrease in the reflected backward light of the laser diode.

Accordingly, the present invention makes it possible to efficiently detect the backward light of the laser diode with the monitoring light detector.

The optical transmitter according to a third embodiment of the invention is equipped with a laser diode and a light detector provided on a packaging base, in which the light detector has a semiconductor junction plane, and a side surface which is roughly orthogonal to the semiconductor junction plane, wherein the light detector is inclined so as to send the output light from the laser diode incident from the side surface to the semiconductor junction plane of the light detector.

In the third embodiment of the invention, the monitoring light detector is packaged in an inclined state. For this reason, the backward light from the laser diode incident from the side surface roughly orthogonal to the semiconductor junction plane of the light detector propagates inside the light detector toward the semiconductor junction plane. Then, the backward light of the laser diode absorbed by the depletion layer is converted to an electric current.

Accordingly, compared with the case where packaging is carried out with the monitoring light detector not being inclined, it becomes possible to increase the amount of backward light absorbed by the depletion layer, and this makes it possible to efficiently detect the backward light of the laser diode with the monitoring light detector.

In the optical transmitter according to the fifth embodiment of the invention the present invention also provides that the packaging plane of the laser diode and the light detector is provided with a step difference so as to send the beam center line of the output light from the laser diode incident from the side surface to the semiconductor junction plane.

In the fifth embodiment of the invention, in the case where the height from the packaging plane to the output port of the laser diode is different than the height from the packaging plane to the semiconductor junction plane, a step difference is provided in the packaging plane of the laser diode and the light detector to adjust the heights of the output port of the laser diode and the semiconductor junction plane of the light detector. Accordingly, in the case where the light detector is provided on an inclined surface having a step difference with respect to the laser diode, because the backward light of the laser diode is detected efficiently, the effect of providing an inclined light detector is made even higher.

The optical transmitter according to a sixth embodiment of the invention is equipped with a laser diode and a light detector provided on a packaging base, in which the light detector has a semiconductor junction plane, and a side surface which is roughly orthogonal to the semiconductor junction plane, wherein the light detector is arranged so that the output light from the laser diode is incident from the side surface, and a reflecting film is formed on all or a portion of the outside surfaces of the light detector excluding the side surface.

In the sixth embodiment of the invention, because the monitoring light detector is provided on the same packaging base as the laser diode, the backward light of the laser diode is incident inside the light detector from the side surface roughly orthogonal to the semiconductor junction plane of the light detector. Because the inside of the light detector is designed to be transparent to the wavelength of the output light from the laser diode, the backward light of the laser diode propagates inside the light detector, and is reflected by the surface facing the side surface. When such facing surface is covered with a reflecting film, the backward light from the laser diode is almost entirely reflected. The reflected backward light from the laser diode is absorbed by the depletion layer of the light detector. Even in the case where the reflected backward light from the laser diode is not absorbed directly by the depletion layer, when the other surfaces in addition to the facing surface are also covered with a reflecting film, multiple reflections are carried out by these surfaces covered with a reflecting film, and then the backward light is finally absorbed by the depletion layer of the light detector. Accordingly, compared with the case where all or a portion of the outside surfaces of the light detector are not covered with a reflecting film, the present invention makes it possible to increase the amount of backward light detected by the light detector.

On the other hand, when stray light inside the optical transmitter is detected by the depletion layer of the light detector, such stray light causes outside interference with the negative feedback loop, and there was the risk that the negative feedback loop for stabilizing the output light of the laser diode will not be carried out normally. In the sixth embodiment of the invention, because all or a portion of the outside surfaces of the light detector excluding the side surface where the output light from the laser diode is incident are covered with a reflecting film, it is possible to prevent stray light inside the optical transmitter from entering the light detector. Accordingly, compared with the case where the outside surfaces of the light detector are not covered with a reflecting film, it is possible to create a stable negative feedback loop for controlling the output light of the laser diode.

As described above, the sixth embodiment of the invention makes it possible to efficiently detect the backward light of the laser diode with the monitoring light detector, and makes it possible to prevent stray light inside the optical transmitter from entering the light detector.

In the optical transmitters according to the present invention the present invention also contemplates forming a reflecting film on all or a portion of the outside surfaces of the light detector excluding the side surface where the output light from the laser diode is incident.

In these embodiments of the present invention, because all or a portion of the outside surfaces of the light detector excluding the side surface where the output light from the laser diode is incident are covered with a reflecting film, the backward light from the laser diode incident from the side surface of the light detector is almost entirely reflected by the surfaces covered with the reflecting film. Then, the reflected backward light from the laser diode is absorbed by the depletion layer of the light detector. Accordingly, compared with the case where the outside surfaces are not covered with a reflecting film, it is possible to increase the amount of backward light detected by the light detector. Furthermore, it is possible to prevent stray light inside the optical transmitter from entering the light detector. Accordingly, compared with the case where the outside surfaces of the light detector are not covered with a reflecting film, it is possible to create a stable negative feedback loop for controlling the output light of the laser diode.

DETAILED DESCRIPTION OF THE PREFERRED EMBODIMENTS

Figure 1:
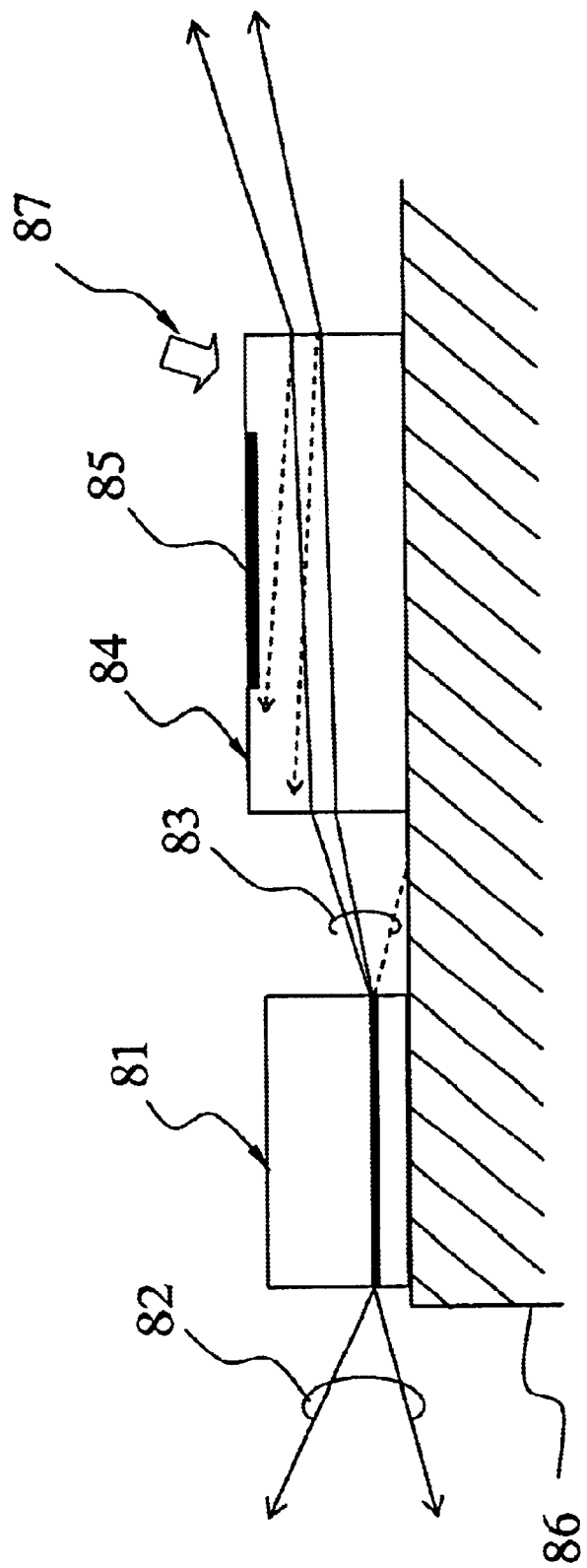
FIG. 1 is a schematic explanatory drawing showing the structure of a prior art optical transmitter.
Figure 2A:
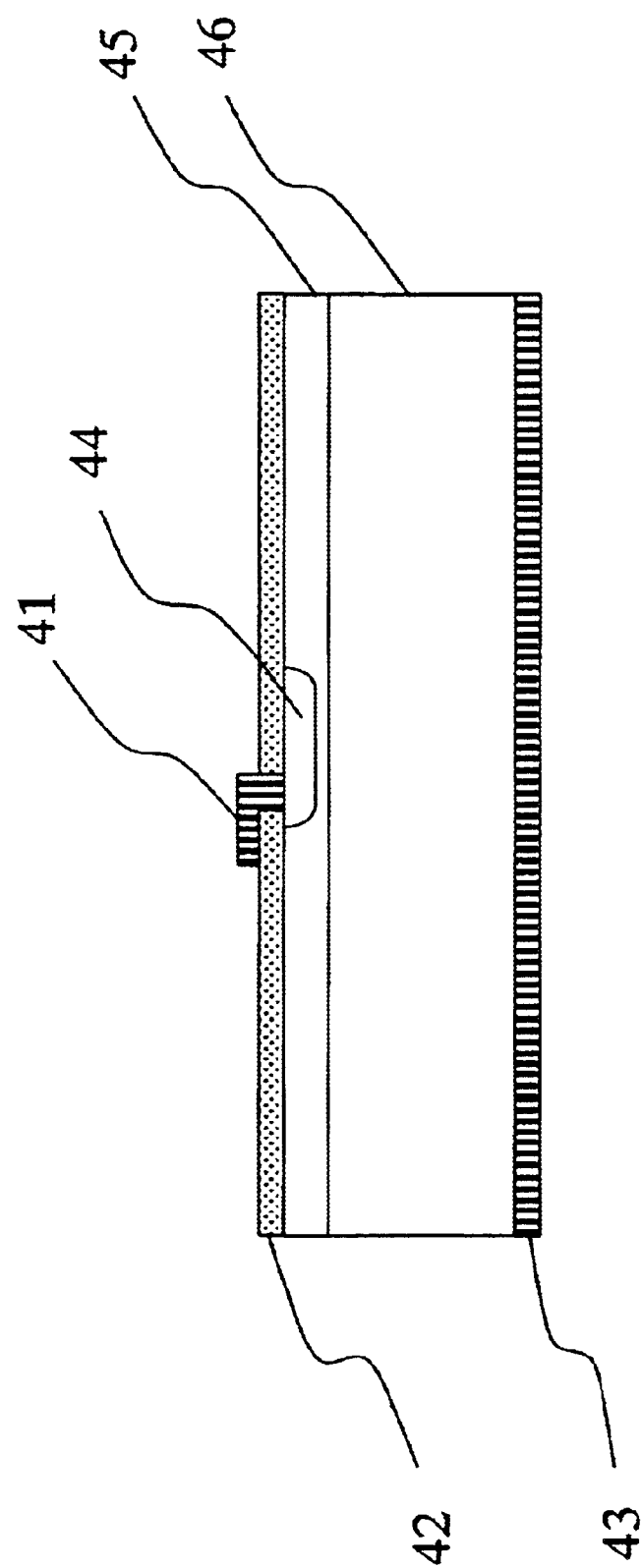
FIGS. 2(a) and 2(b) are schematic structural drawings of light detectors applied to the present invention.
Figure 2B:
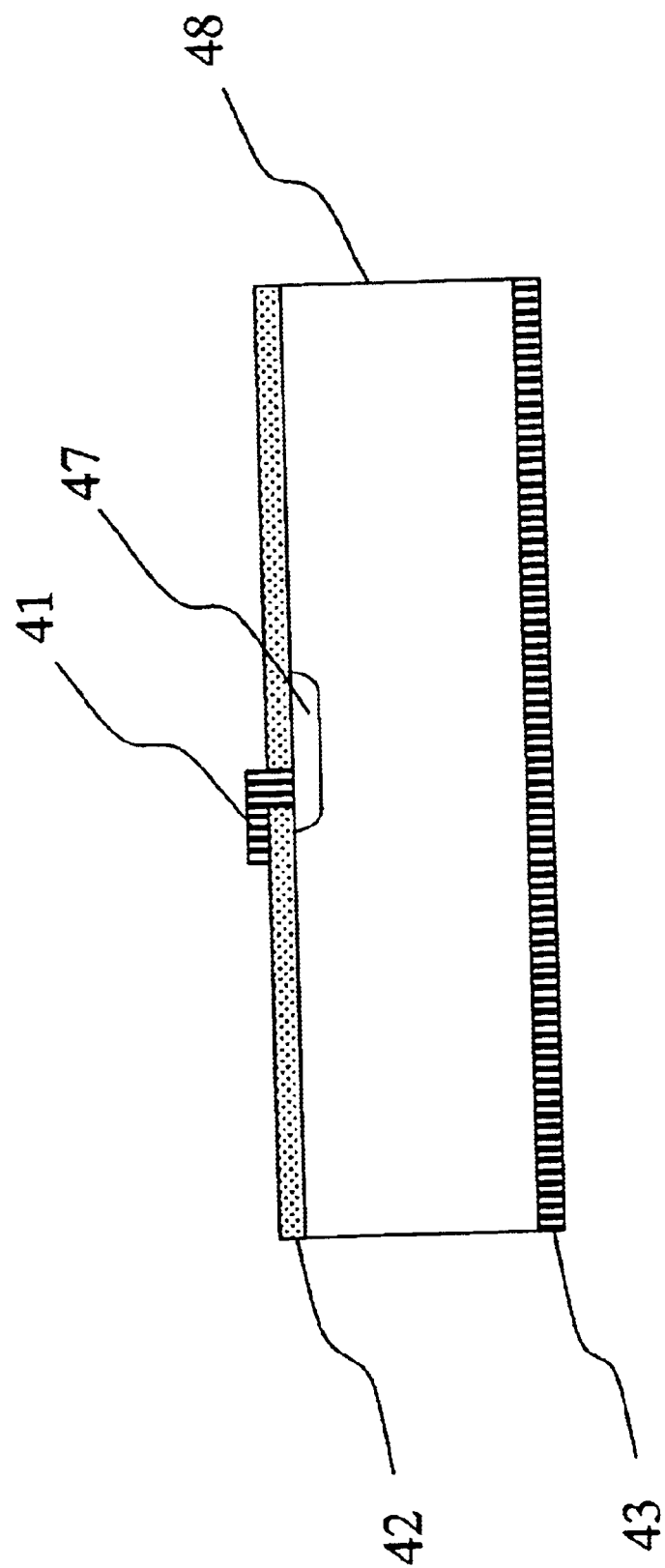

FIG. 2(a) and FIG. 2(b) show schematic drawings of the structure of light detectors applied to the present invention. FIG. 2(a) shows the example of a PIN photodiode. The surfaces between a $p^+$ layer 44 and an i layer 45, and between the i layer 45 and a $n^+$ layer 46 (semiconductor substrate) form a semiconductor junction plane. When negative is applied to the $p^+$ layer 44 via an electrode 41 and positive is applied to the $n^+$ layer 46 via an electrode 43, a light absorbing depletion layer is formed on the i layer 45. FIG. 2(b) shows the example of a PN junction photodiode. The surface between a $p^+$ layer 47 and a $n^+$ layer 48 (semiconductor substrate) forms a semiconductor junction plane. When negative is applied to the $p^+$ layer 47 via an electrode 41 and positive is applied to the $n^+$ layer 48 via an electrode 43, a light absorbing depletion layer is formed near the junction plane of the p⁺ layer 47 and the n⁺ layer 48. In either case, for the n⁺ layer 46 and the n⁺ layer 48 having a thickness of 200 μm, the p⁺ layer 44, the p⁺ layer 47 and the i layer 45 are formed to have a thickness of several μm.

First Embodiment of the Invention

Figure 3A:
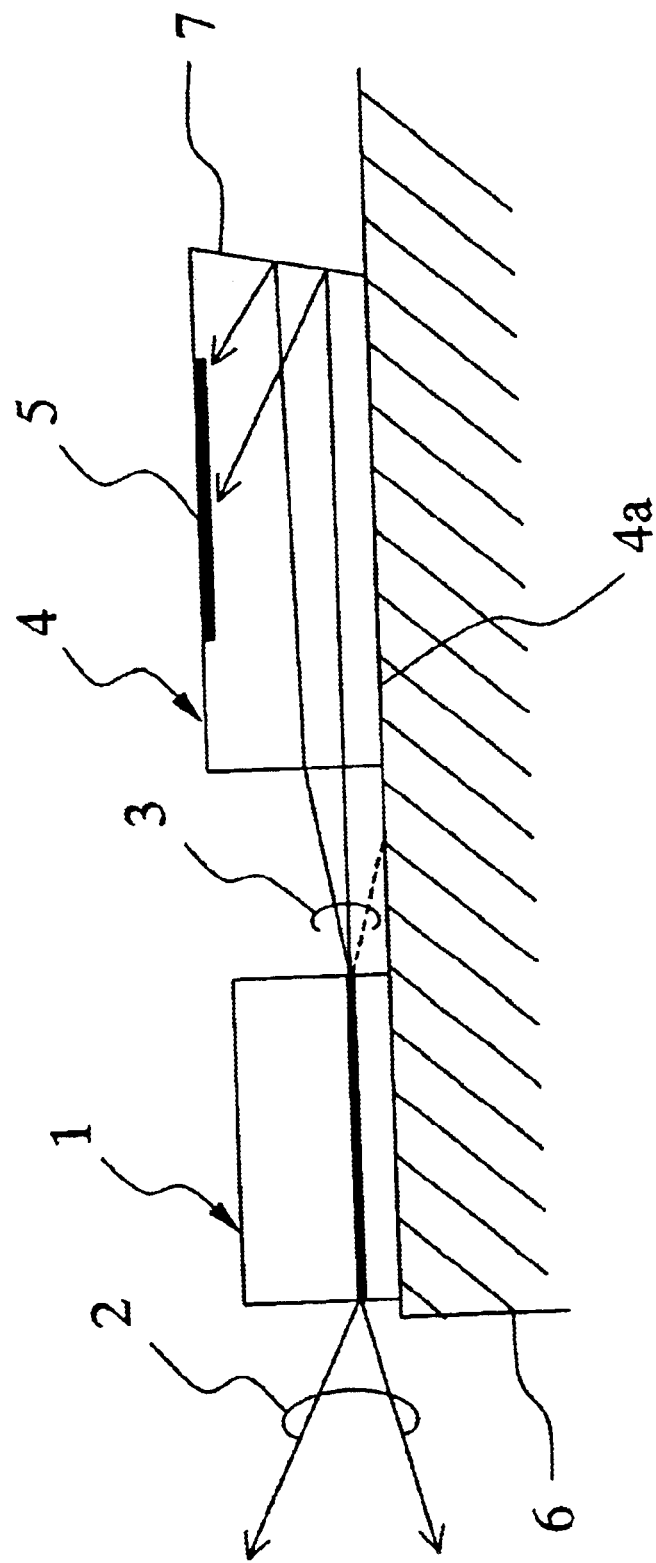
FIGS. 3(a) and 3(b) are cross-sectional schematic explanatory drawings of optical transmitters forming embodiments of the present invention.
Figure 3B:
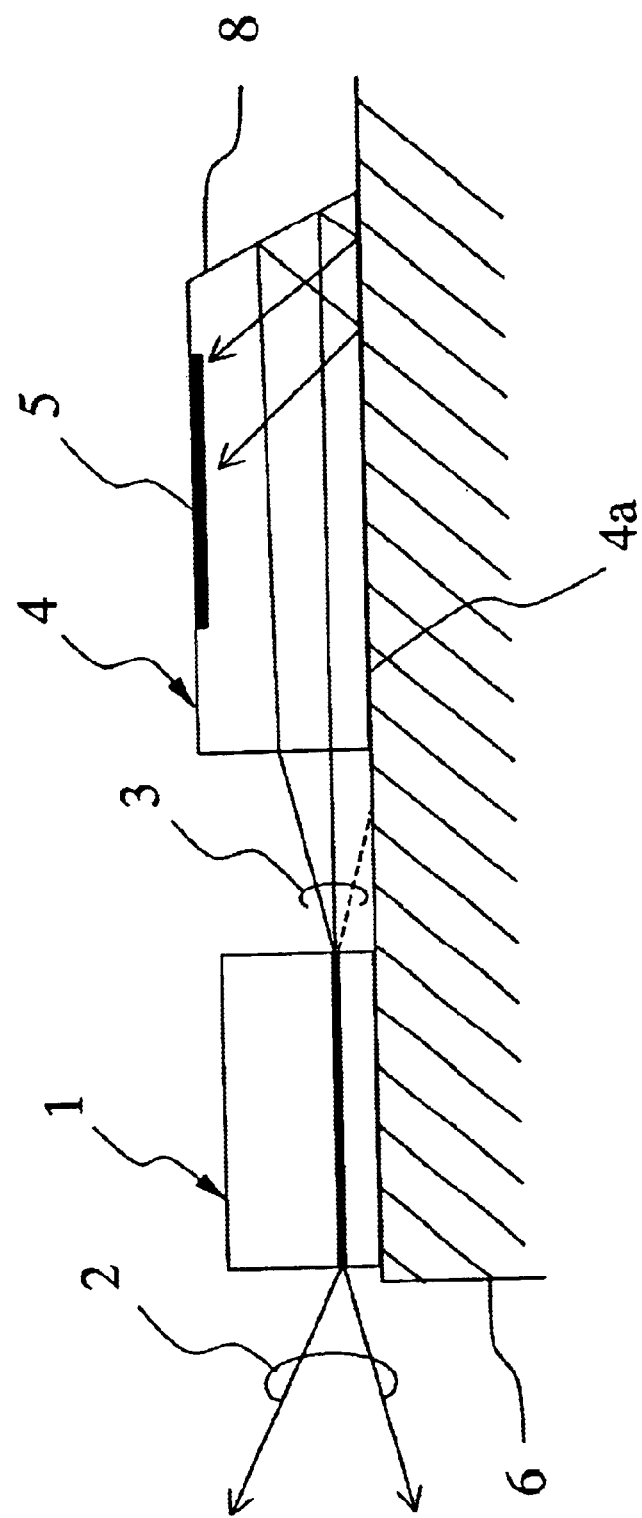

The special feature of the present embodiment is a structure designed to improve the light detecting efficiency by inclining a side surface in a monitoring light detector which is provided on the same packaging base as a laser diode. FIGS. 3(a) and 3(b) show the embodiment of the present invention. A description is given below based on these drawings.

As shown in FIG. 3(a), a laser diode 1 and a light detector 4 are provided in a packaging base 6. The light detector 4 is provided so that a side of a semiconductor substrate 4a is arranged on a side of the packaging base 6. Backward light 3 from the laser diode 1 is incident on the light detector 4 from the side surface of the light detector 4 facing the laser diode 1. When selecting a material for the light detector 4, it is possible to make the light detector 4 transparent to the output light of the laser diode 1. Because the refractive index of InGaAs used as a light detector is 3.56 which is large compared to the refractive index of air, in the case where such side surface is roughly orthogonal to a semiconductor junction plane 5 of the light detector 4, the backward light 3 incident from such side surface propagates inside the light detector 4 roughly parallel to the semiconductor junction plane 5 of the light detector 4, and is reflected by a surface 7 facing the incident side surface. Because the facing surface 7 is inclined so as to make the angle formed between the facing surface 7 and the semiconductor junction plane 5 of the light detector 4 form an acute angle, the reflected backward light 3 is sent to the semiconductor junction plane 5 of the light detector 4, and after absorption by a depletion layer, the backward light 3 is converted to an electric current.

Accordingly, in the case where the facing surface of the light detector is not inclined, because the backward light of the laser diode undergoes multiple reflections between both side surfaces, when considering the reflectance by the side surfaces and the transparency of the light detector, the method of inclining the facing surface 7 to cause reflection makes it possible to detect the backward light from the laser diode with good efficiency.

FIG. 3(b) is an example in which the facing surface of the light detector is inclined so that the angle formed between such facing surface and the semiconductor junction plane of the light detector forms an obtuse angle. As shown in FIG. 3(b), a laser diode 1 and a light detector 4 are provided in a packaging base 6. A side of a semiconductor substrate 4a of the light detector 4 is arranged on a side of the packaging base 6. The backward light 3 from the laser diode 1 is incident from the side surface of the light detector 4 facing the laser diode 1. The incident backward light 3 propagates inside the light detector 4 roughly parallel to a semiconductor junction plane 5, and is reflected by a surface 8 facing such incident side surface. Because the facing surface 8 is inclined so as to make the angle formed between the facing surface 8 and the semiconductor junction plane 5 of the light detector 4 form an obtuse angle, after the reflected backward light 3 is reflected again by the bottom surface of the side of the semiconductor substrate 4a of the light detector 4, such reflected backward light 3 is sent to the semiconductor junction plane 5, and then after absorption by a depletion layer, the backward light 3 is converted to an electric current.

Accordingly, in the case where the facing surface is not inclined, because the backward light of the laser diode undergoes multiple reflections between both side surfaces, when considering the reflectance by the side surfaces and the transparency of the light detector, the method of inclining the facing surface to cause reflection makes it possible to detect the backward light from the laser diode with good efficiency.

Second Embodiment of the Invention

Figure 4A:
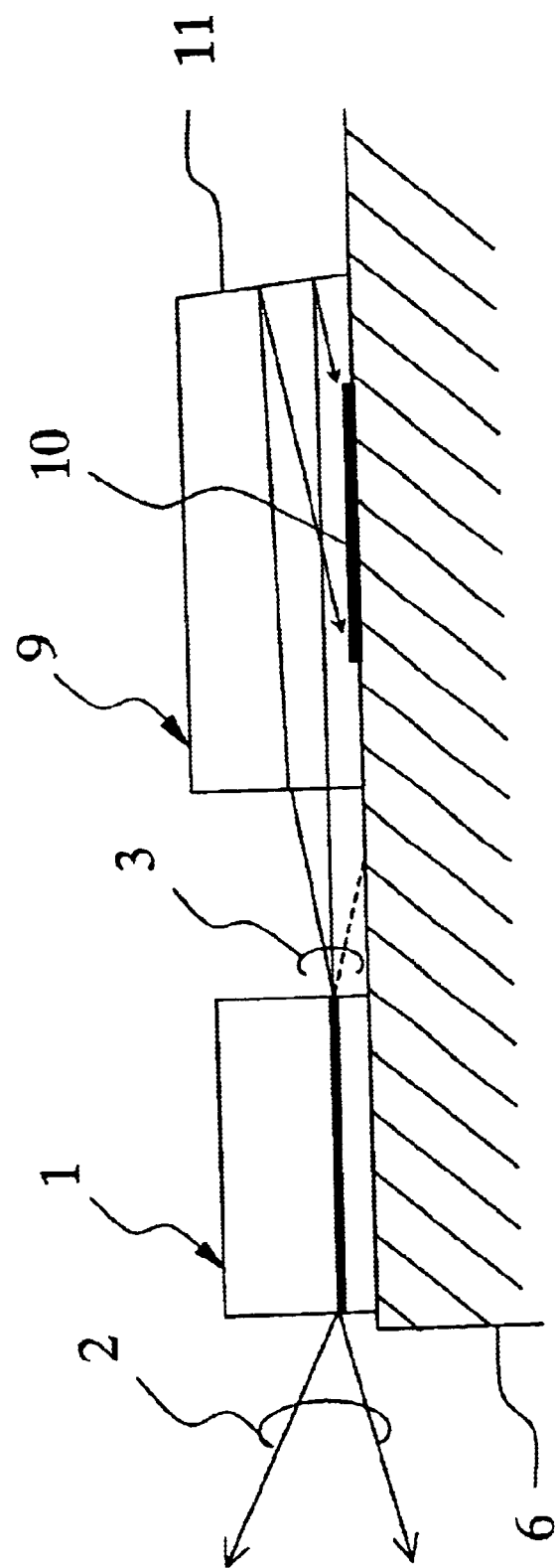
FIGS. 4(a) and 4(b) are cross-sectional schematic explanatory drawings of optical transmitters forming embodiments of the present invention.
Figure 4B:
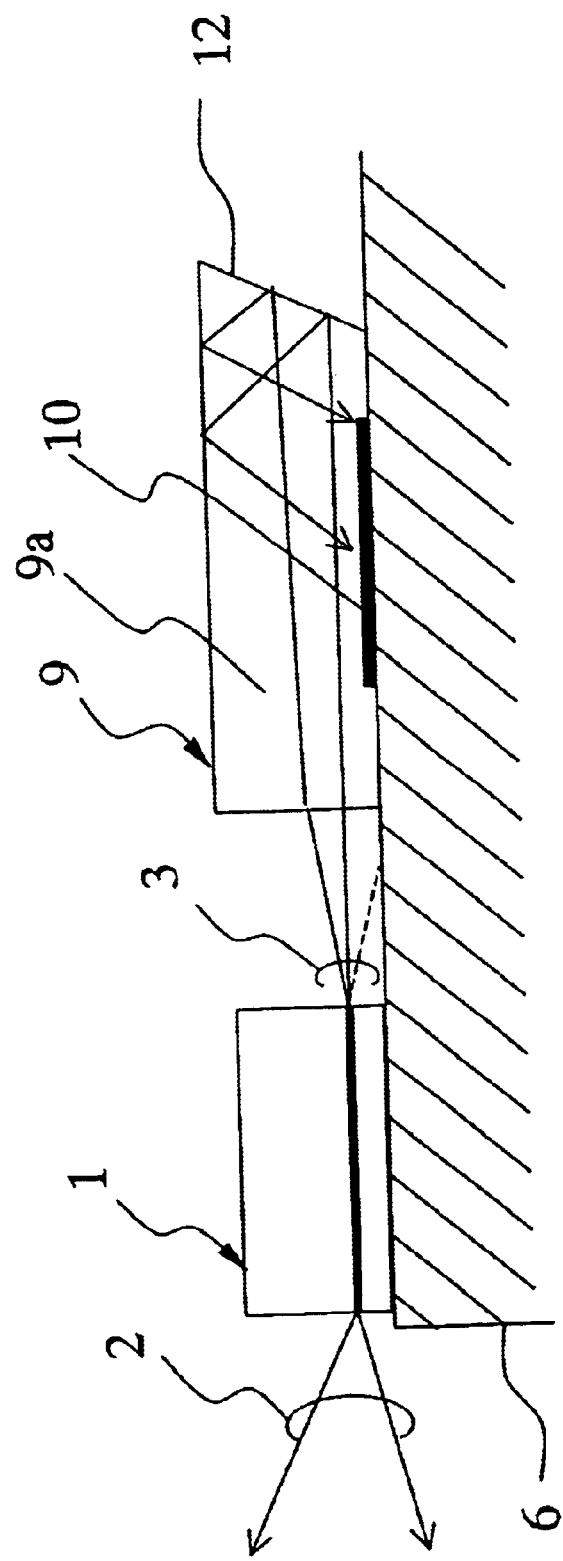

The special feature of the present embodiment is a structure designed to improve the light detecting efficiency by inclining a side surface in a monitoring light detector which is provided on the same packaging base as a laser diode. FIGS. 4(a) and 4(b) show the embodiment of the present invention. A detailed description is given below based on these drawings.

As shown in FIG. 4(a), the backward light 3 from a laser diode 1 provided in a packaging base 6 is incident on a side surface of a light detector 9. The light detector 9 is provided so that a semiconductor junction plane 10 is arranged on a side of the packaging base 6. In the same way as that for FIG. 3(a), the backward light 3 incident from such front end side surface propagates inside the light detector 9 roughly parallel to the semiconductor junction plane 10, and is reflected by a surface 11 facing such incident side surface. Because the facing surface 11 is inclined so as to make the angle formed between the facing surface 11 and the semiconductor junction plane 10 form an acute angle, the reflected backward light 3 is sent to the semiconductor junction plane 10 of the light detector 9, and after absorption by a depletion layer, the backward light 3 is converted to an electric current.

Accordingly, when the rear end side surface is inclined to cause reflection, the backward light from the laser diode can be detected with good efficiency.

FIG. 4(b) shows an example in which the surface of the light detector facing the side surface where the backward light from the laser diode is incident is inclined so that the angle formed between such facing surface and the semiconductor junction plane of the light detector forms an obtuse angle. As shown in FIG. 4(b), the backward light 3 from a laser diode 1 provided in a packaging base 6 is incident on a side surface of a light detector 9. The light detector 9 is provided on the packaging base 6 so that a semiconductor junction plane 10 is arranged on a side of the packaging base 6. In the same way as that for FIG. 3(b), the backward light 3 incident from such side surface propagates inside the light detector 9 roughly parallel to the semiconductor junction plane 10, and is reflected by a surface 12 facing such side surface. Because the facing surface 12 is inclined so as to make the angle formed between the facing surface 12 and the semiconductor junction plane 10 of the light detector 9 form an obtuse angle, after the reflected backward light 3 is reflected again by the upper surface of a semiconductor substrate side 9a of the light detector 9, such reflected backward light 3 is sent to the semiconductor junction plane 10, and then after absorption by a depletion layer, the light is converted to an electric current.

Accordingly, when the rear end side surface is inclined to cause reflection, the backward light from the laser diode can be detected with good efficiency.

Further, the inclined surface of the light detector 4 in FIG. 3(a) and FIG. 3(b), or the inclined surface of the light detector 9 in FIG. 4(a) and FIG. 4(b) can be obtained by using the cleavage of a semiconductor crystal, by carrying out anisotropic etching on the light detector, or by dicing the light detector obliquely.

Third Embodiment of the Invention

Figure 5A:
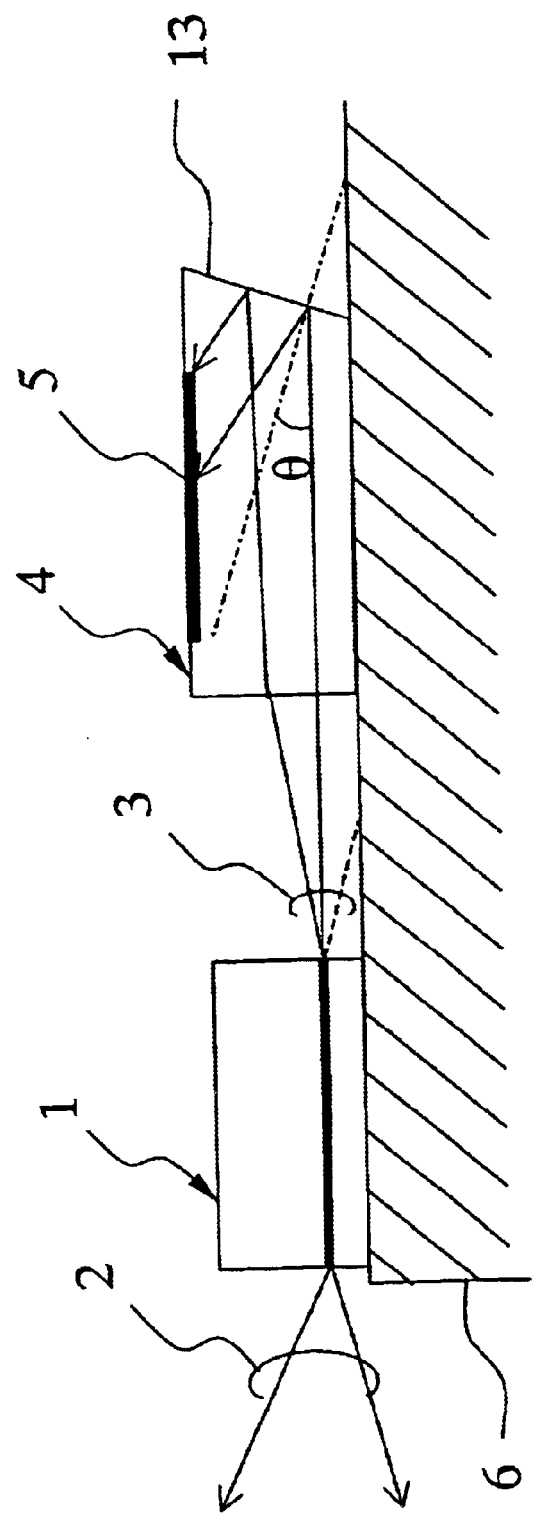
FIGS. 5(a) and 5(b) are cross-sectional schematic explanatory drawings of optical transmitters forming embodiments of the present invention.
Figure 5B:
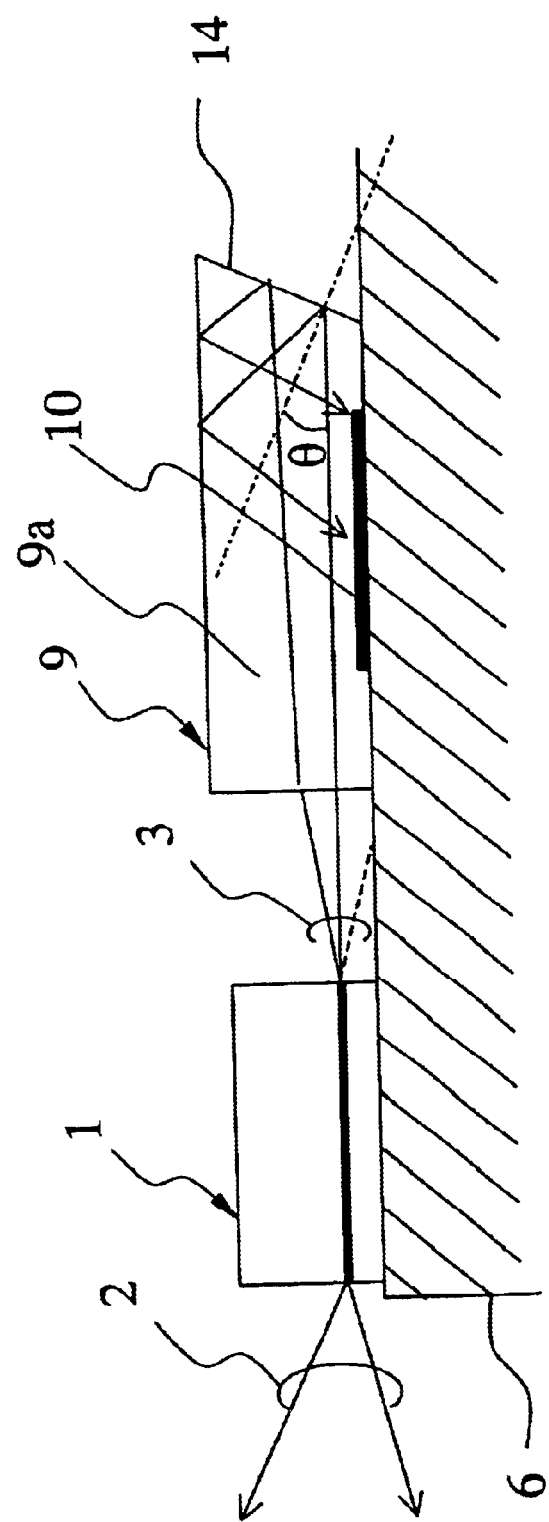

The special feature of the present embodiment is a structure which makes it possible for the monitoring light detector inside the optical transmitter to efficiently detect the backward light from the laser diode by using total reflection inside the monitoring light detector. FIGS. 5(a) and 5(b) show the embodiment of the present invention. A detailed description is given below based on these drawings.

As shown in FIG. 5(a), the backward light 3 from a laser diode 1 provided in a packaging base 6 is incident on a side surface of a light detector 4. The side of the light detector 4 facing the semiconductor junction plane 5 is arranged on a side of the packaging base 6. When selecting a material for the light detector 4, it is possible to make the light detector 4 transparent to the output light of the laser diode 1. Because the refractive index of InGaAs used as a light detector is 3.56 which is large compared to the refractive index of air, in the case where such side surface is roughly orthogonal to the semiconductor junction plane 5 of the light detector 4, the backward light 3 incident from such side surface propagates inside the light detector 4 roughly parallel to the semiconductor junction plane 5, and is reflected by a surface 13 facing such side surface. Because the facing surface 13 is inclined so as to make the angle formed between the facing surface 13 and the semiconductor junction plane 5 of the light detector 4 form an acute angle, the reflected backward light 3 is sent to the semiconductor junction plane 5 of the light detector 4, and after absorption by a depletion layer, the light is converted to an electric current.

In this regard, when the facing surface 13 is inclined so that the incident angle formed by the beam center line of the backward light 3 from the laser diode 1 on the facing surface 13 is greater than or equal to a critical angle, the reflection of the backward light 3 from the laser diode 1 by the facing surface 13 forms a total reflection.

Accordingly, compared with the case where there is not total reflection, the present invention makes it possible to detect backward light from the laser diode with good efficiency.

FIG. 5(b) shows an example in which the surface of the light detector facing the side surface where the backward light from the laser diode is incident is inclined so that the angle formed between such facing surface and the semiconductor junction plane of the light detector forms an obtuse angle. As shown in FIG. 5(b), the backward light 3 from a laser diode 1 provided in a packaging base 6 is incident on a side surface of a light detector 9. The light detector 9 is provided so that a semiconductor junction plane 10 is arranged on a side of the packaging base 6. The backward light 3 incident from such side surface propagates inside the light detector 9 roughly parallel to the semiconductor junction plane 10, and is reflected by a surface 14 facing such side surface. Because the facing surface 14 is inclined so as to make the angle formed between the facing surface 14 and the junction plane 10 of the light detector 9 form an obtuse angle, the reflected backward light 3 is sent to the upper surface of the semiconductor substrate side 9a, and after reflection by the opposite surface, such reflected backward light 3 is then absorbed by the depletion layer and converted to an electric current.

In this regard, when the facing surface 14 is inclined so that the incident angle formed by the beam center line of the backward light 3 from the laser diode 1 on the facing surface 14 is greater than or equal to a critical angle, the reflection of the backward light 3 from the laser diode 1 by the facing surface 14 forms a total reflection.

Accordingly, compared with the case where there is not total reflection, the present invention in which total reflection by the light detector side surfaces is obtained makes it possible to detect backward light from the laser diode with good efficiency.

Fourth Embodiment of the Invention

Figure 6A:
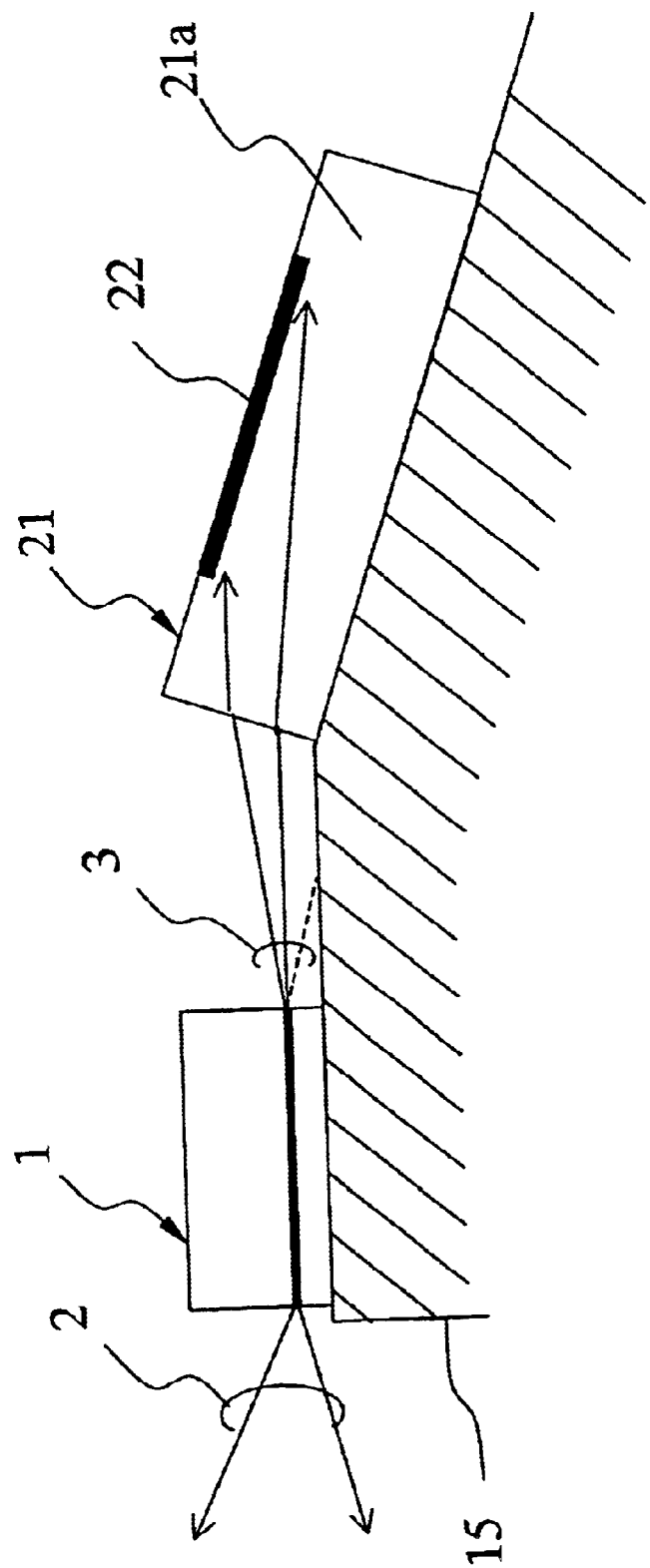
FIGS. 6(a) and 6(b) are cross-sectional schematic explanatory drawings of optical transmitters forming embodiments of the present invention.
Figure 6B:
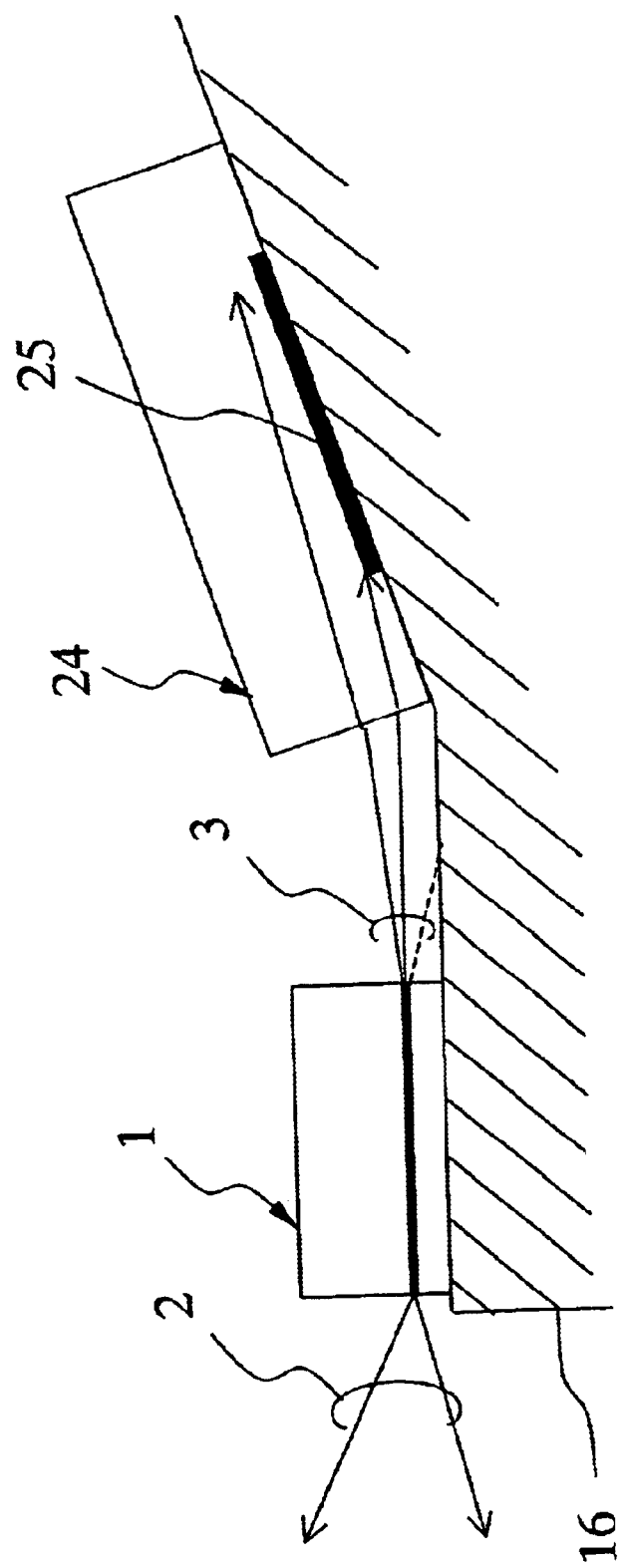

The special feature of the present embodiment is a structure which makes it possible for the monitoring light detector inside the optical transmitter to efficiently detect the backward light from the laser diode by inclining the monitoring light detector itself which is provided on the packaging base inside optical transmitter. FIGS. 6(a) and 6(b) show the embodiment according to the present invention. A detailed description is given below based on these drawings.

As shown in FIG. 6(a), a packaging base 15 has a level surface and an inclined surface which make the top surface convex. A laser diode 1 is provided on the level surface of the packaging base 15, and a light detector 21 is provided on the inclined surface. The light detector 21 is provided so that a side of a semiconductor substrate 21a is arranged on a side of the packaging base 15. The backward light 3 from the laser diode 1 is incident from the side surface of the light detector 21 facing the laser diode 1. When selecting a material for the light detector 21, it is possible to make the light detector 21 transparent to the output light of the laser diode 1. Because the light detector 21 is provided on the inclined surface of the packaging base 15, the backward light 3 incident on the light detector 21 is sent to a semiconductor junction plane 22 of the light detector 21. Then, the backward light 3 absorbed by the depletion layer near the semiconductor junction plane 22 is converted to an electric current.

Accordingly, in the case where the light detector provided on the packaging base is inclined with respect to the laser diode, because the backward light of the laser diode is sent straight to the semiconductor junction plane, it is possible to detect backward light from the laser diode with good efficiency.

FIG. 6(b) shows an example in which the top surface of a packaging base 16 is made concave. As shown in FIG. 6(b), the packaging base 16 has a level surface and an inclined surface which make the top surface concave. A laser diode 1 is provided on the level surface of the packaging base 16, and a light detector 24 is provided on the inclined surface. The light detector 24 is provided so that a semiconductor junction plane 25 is arranged on a side of the packaging base 16. The backward light 3 from the laser diode 1 is incident on the side surface of the light detector 24 facing the laser diode 1. Because the light detector 24 is provided on the inclined surface of the packaging base 16, the backward light 3 incident on the light detector 24 is sent to the semiconductor junction plane 25. Then, the backward light 3 absorbed by the depletion layer near the semiconductor junction plane 25 is converted to an electric current.

Accordingly, in the case where the light detector provided on the packaging base is inclined with respect to the output surface of the laser diode, because the backward light of the laser diode is sent straight to the semiconductor junction plane, it is possible to detect backward light from the laser diode with good efficiency.

Fifth Embodiment of the Invention

Figure 7:
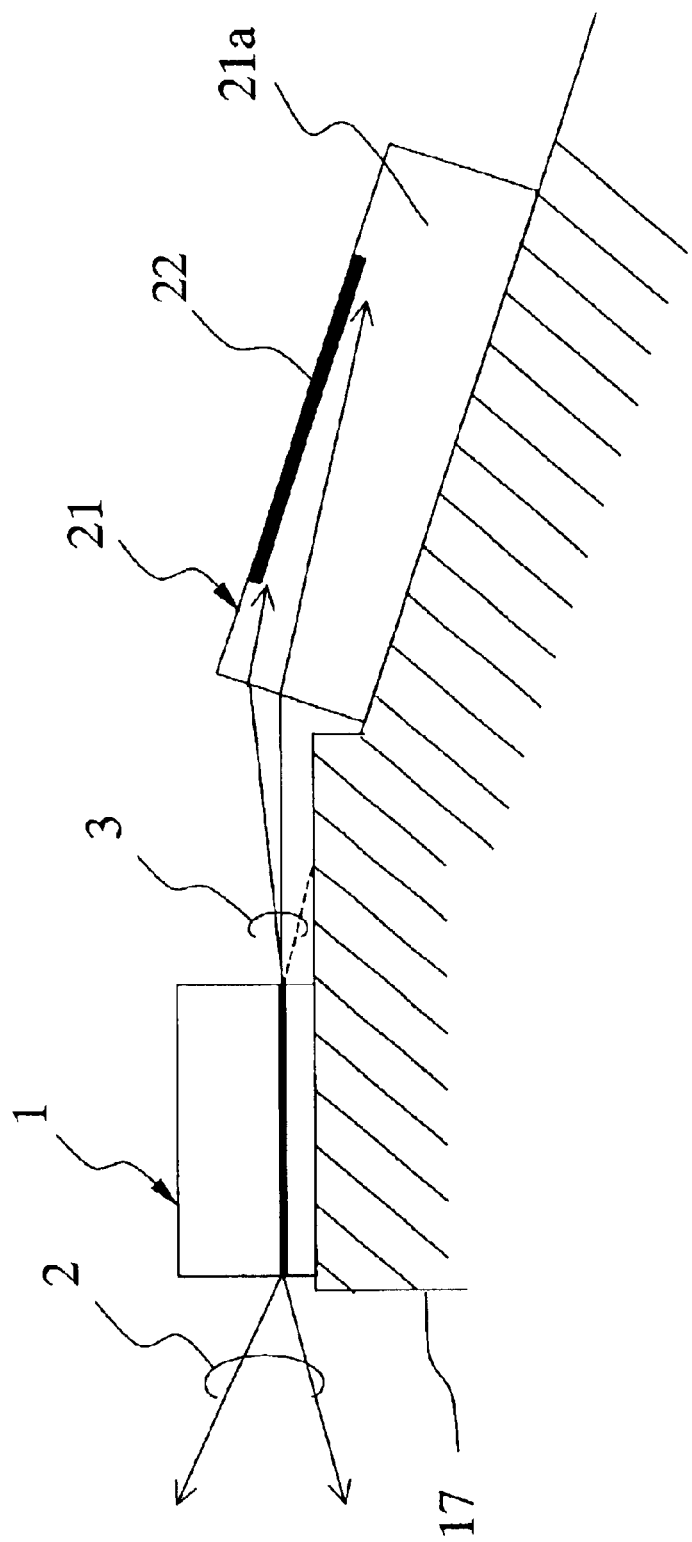
FIG. 7 is a cross-sectional schematic explanatory drawing of an optical transmitter forming an embodiment of the present invention.

The special feature of the present embodiment is a structure which makes it possible for the monitoring light detector inside the optical transmitter to efficiently detect the backward light from the laser diode by inclining the monitoring light detector itself inside the optical transmitter, and by providing the packaging base with a step difference on which the light detector is provided. FIG. 7 shows the embodiment according to the present invention. A detailed description is given below based on this drawing.

A packaging base 17 has a level surface and an inclined surface which make the top surface convex, and the inclined surface is provided with a step difference with respect to the level surface. A laser diode 1 is provided on the level surface of the packaging base 17, and a light detector 21 is provided on the inclined surface. The light detector 21 is provided so that a side of a semiconductor substrate 21a is arranged on a side of the packaging base 17. Because the light detector 21 is provided on the inclined surface having the step difference, the backward light 3 from the laser diode 1 is incident on the side surface of a relatively upper portion of the light detector 21. In the case where the output port of the laser diode 1 is arranged at a low position from the surface of the packaging base 17, or in the case where the light detector 21 is thick, or in the case where a semiconductor junction plane 22 of the light detector 21 is arranged at a high position from the surface of the packaging base 17 or the like, the backward light 3 is sent straight to the semiconductor junction plane 22 of the light detector 21 by the provision of such step difference. Then, the backward light 3 absorbed by the depletion layer near the semiconductor junction plane 22 is converted to an electric current.

Accordingly, in the case where the light detector is provided on an inclined surface having a step difference with respect to the laser diode, because the backward light of the laser diode is detected efficiently, the effect of providing an inclined light detector is made even higher.

Sixth Embodiment of the Invention

Figure 8A:
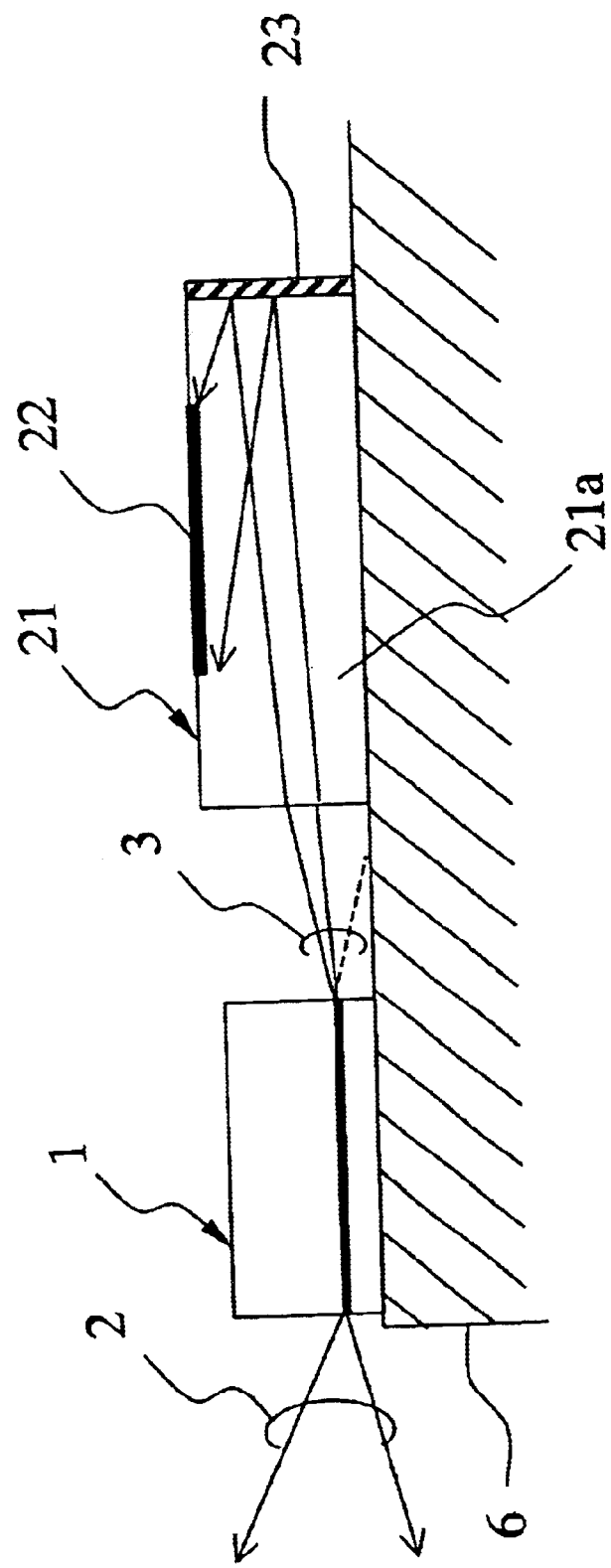
FIGS. 8(a) and 8(b) are cross-sectional schematic explanatory drawings of optical transmitters forming embodiments of the present invention.
Figure 8B:
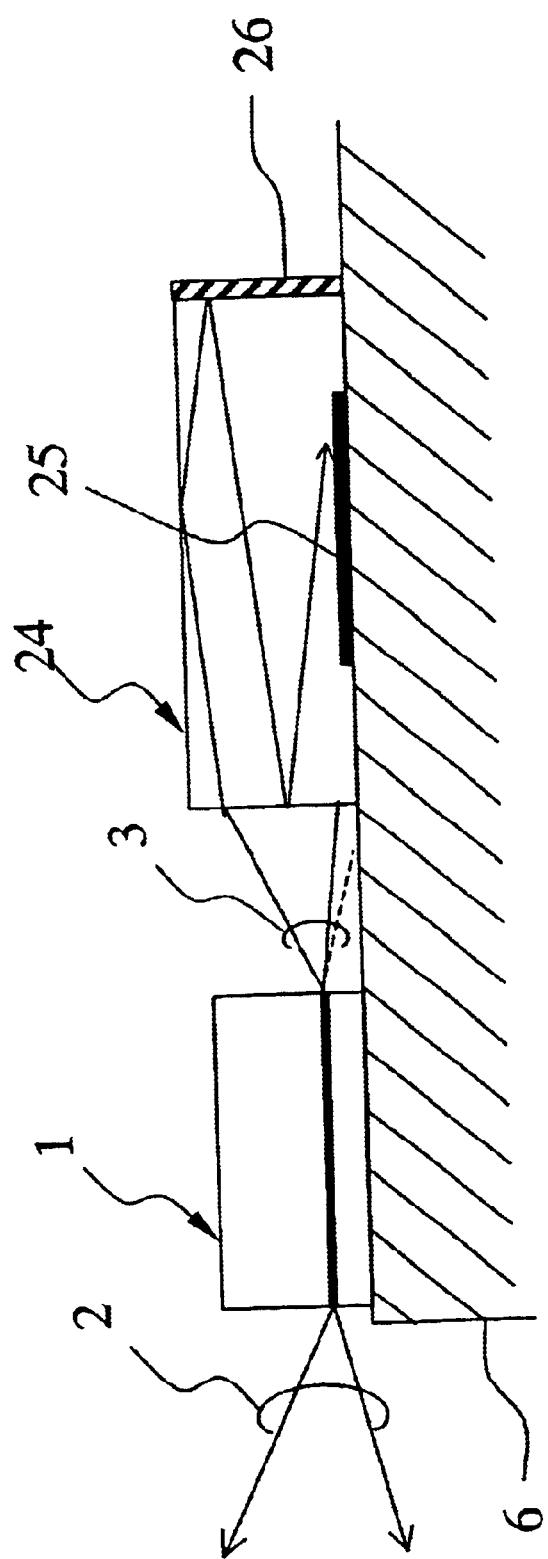

The special feature of the present embodiment is a structure which makes it possible for the monitoring light detector inside the optical transmitter to efficiently detect the backward light from the laser diode by covering a side surface of the monitoring light detector with a reflecting film. FIGS. 8(a) and 8(b) show the embodiment of the present invention. A detailed description is given below based on these drawings.

As shown in FIG. 8(a), the backward light 3 from a laser diode 1 provided in a packaging base 6 is incident on a side surface of a light detector 21. The light detector 21 is provided so that a side of a semiconductor substrate 21a is arranged on a side of the packaging base 6. When selecting a material for the light detector 21, it is possible to make the light detector 21 transparent to the output light of the laser diode 1. Because the refractive index of InGaAs used as a light detector is 3.56 which is large compared to the refractive index of air, in the case where such side surface is roughly orthogonal to a semiconductor junction plane 22, the backward light 3 incident from such side surface propagates inside the light detector 21 roughly parallel to the semiconductor junction plane 22, and is reflected by a surface 23 facing such side surface. When the facing surface 23 is covered with a reflecting film, most of the backward light 3 is reflected, and the reflected backward light 3 is absorbed by the depletion layer of the light detector 21, or after repeatedly undergoing reflection between the facing surface 23 and the side surface of the opposite side, the reflected backward light 3 is detected by the depletion layer of the light detector 21 and converted to an electric current.

Accordingly, in the case where a side surface of the light detector is covered with a reflecting film, because the backward light of the laser diode is almost entirely reflected by such side surface, the backward light from the laser diode can be detected with good efficiency.

FIG. 8(b) shows the case where a semiconductor junction plane 25 of a light detector 24 is arranged on a side of a packaging base 6. In the same way as for the case shown in FIG. 8(a), the backward light 3 incident from a side surface of the light detector 24 propagates inside the light detector 24 roughly parallel to the semiconductor junction plane 25, and is reflected by a surface 26 facing such side surface. When the facing surface 26 is covered with a reflecting film, most of the backward light 3 is reflected, and the reflected backward light 3 is absorbed by the depletion layer of the light detector 24, or after repeatedly undergoing reflection between the facing surface 26 and the side surface of the opposite side, the reflected backward light 3 is detected by the depletion layer of the light detector 24 and converted to an electric current.

Accordingly, in the case where a side surface of the light detector is covered with a reflecting film, because the backward light of the laser diode is almost entirely reflected by such side surface, the backward light from the laser diode can be detected with good efficiency.

Seventh Embodiment of the Invention

Figure 9A:
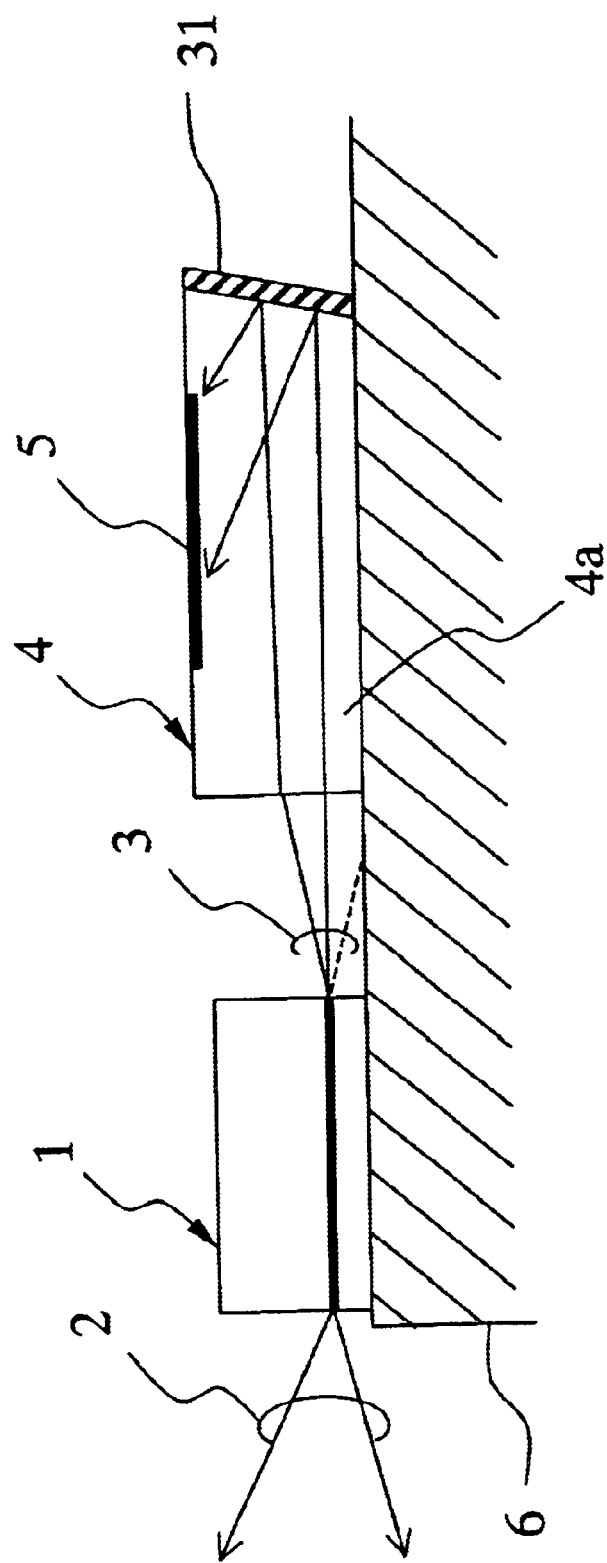
FIGS. 9(a) and 9(b) are cross-sectional schematic explanatory drawings of optical transmitters forming embodiments of the present invention.
Figure 9B:
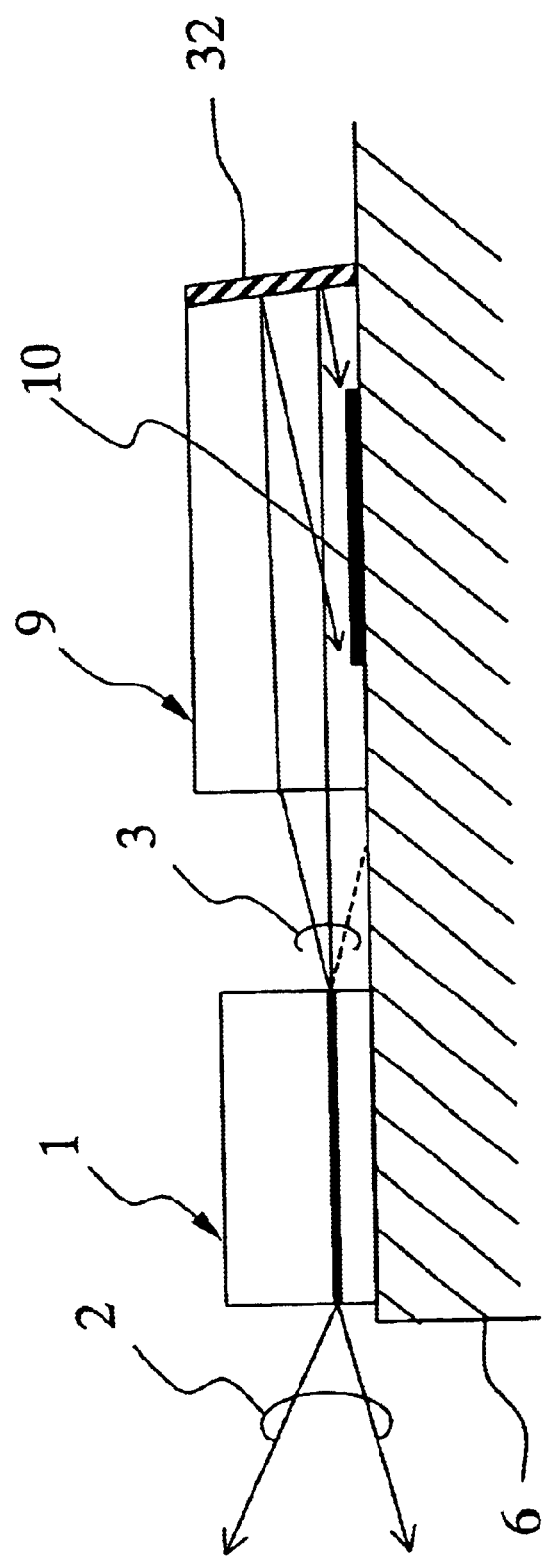

The special feature of the present embodiment is a structure which makes it possible for the monitoring light detector inside the optical transmitter to efficiently detect the backward light from the laser diode by covering the rear end side surface of the monitoring light detector with a reflecting film. FIGS. 9(a) and 9(b) show the embodiment of the present invention. A detailed description is given below based on these drawings.

FIG. 9(a) shows an embodiment in which an inclined side surface of a light detector is covered with a reflecting film. As shown in FIG. 9(a), the backward light 3 from a laser diode 1 provided in a packaging base 6 is incident on a side surface of a light detector 4. The light detector 4 is provided so that a side of a semiconductor substrate 4a is arranged on a side of the packaging base 6. When selecting a material for the light detector 4, it is possible to make the light detector 4 transparent to the output light of the laser diode 1. Because the refractive index of InGaAs used as a light detector is 3.56 which is large compared to the refractive index of air, in the case where such side surface is roughly orthogonal to a semiconductor junction plane 5, the backward light 3 incident from such side surface propagates inside the light detector 4 roughly parallel to the semiconductor junction plane 5, and is reflected by a surface 31 facing such side surface. When the facing surface 31 of the light detector 4 is covered with a reflecting film, most of the backward light 3 from the laser diode 1 is reflected by the facing surface 31. Because the facing surface 31 is inclined so as to make the angle formed between the facing surface 31 and the semiconductor junction plane 5 of the light detector 4 form an acute angle, the reflected backward light 3 is sent to the semiconductor junction plane 5 of the light detector 4, and after absorption by a depletion layer, the backward light 3 is converted to an electric current.

Accordingly, in the case where a side surface of the light detector is covered with a reflecting film, because the backward light of the laser diode is almost entirely reflected by such side surface, the backward light from the laser diode can be detected with good efficiency.

FIG. 9(b) shows an embodiment in which an inclined side surface of a light detector is covered with a reflecting film. As shown in FIG. 9(b), the backward light 3 from a laser diode 1 provided in a packaging base 6 is incident on a side surface of a light detector 9. The light detector 9 is provided so that a semiconductor junction plane 10 is arranged on a side of the packaging base 6. The backward light 3 incident from such side surface of the light detector 9 propagates inside the light detector 9 roughly parallel to a semiconductor junction plane 10, and is reflected by a surface 32 facing such side surface. When the facing surface 32 of the light detector 9 is covered with a reflecting film, most of the backward light 3 from the laser diode 1 is reflected by the facing surface 31. Because the facing surface 32 is inclined so as to make the angle formed between the facing surface 32 and the semiconductor junction plane 10 form an acute angle, the reflected backward light 3 is sent to the semiconductor junction plane 10, and after absorption by a depletion layer, the backward light 3 is converted to an electric current.

Accordingly, in the case where a side surface of the light detector is covered with a reflecting film, because the backward light of the laser diode is almost entirely reflected by such side surface, the backward light from the laser diode can be detected with good efficiency.

Eighth Embodiment of the Invention

Figure 10A:
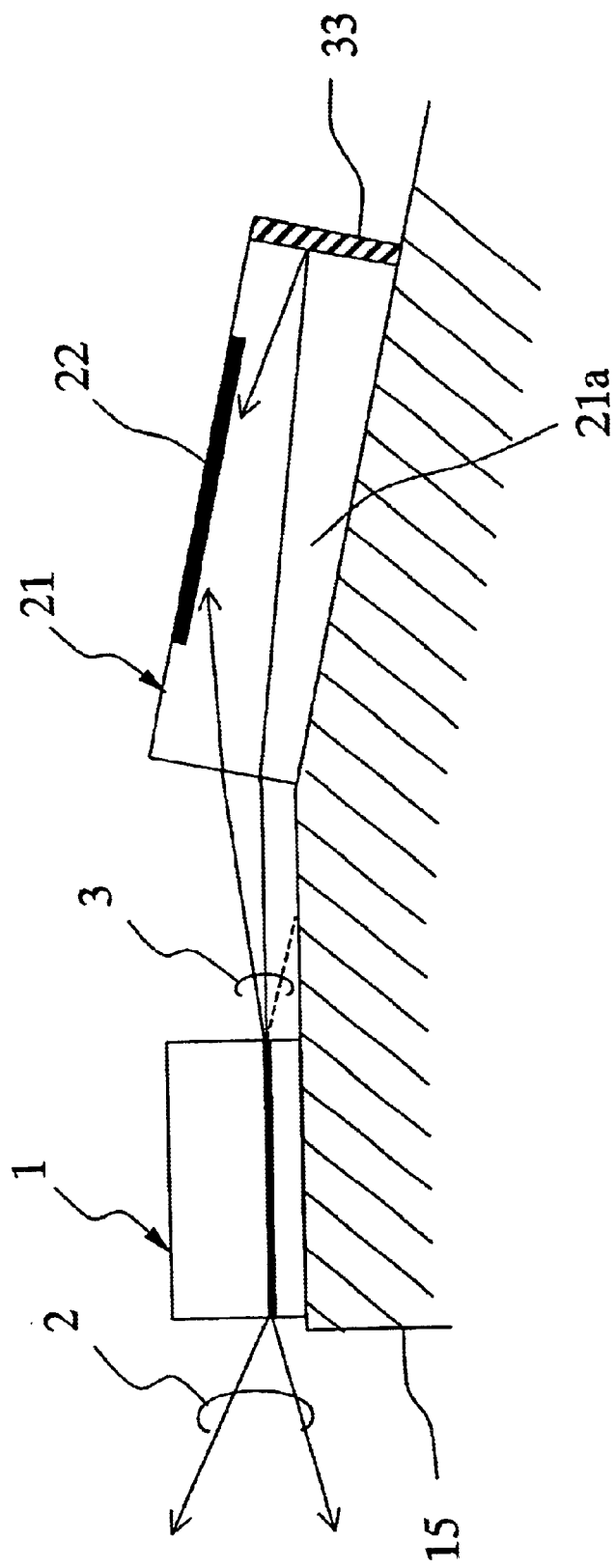
FIGS. 10(a) and 10(b) are cross-sectional schematic explanatory drawings of optical transmitters forming embodiments of the present invention.
Figure 10B:
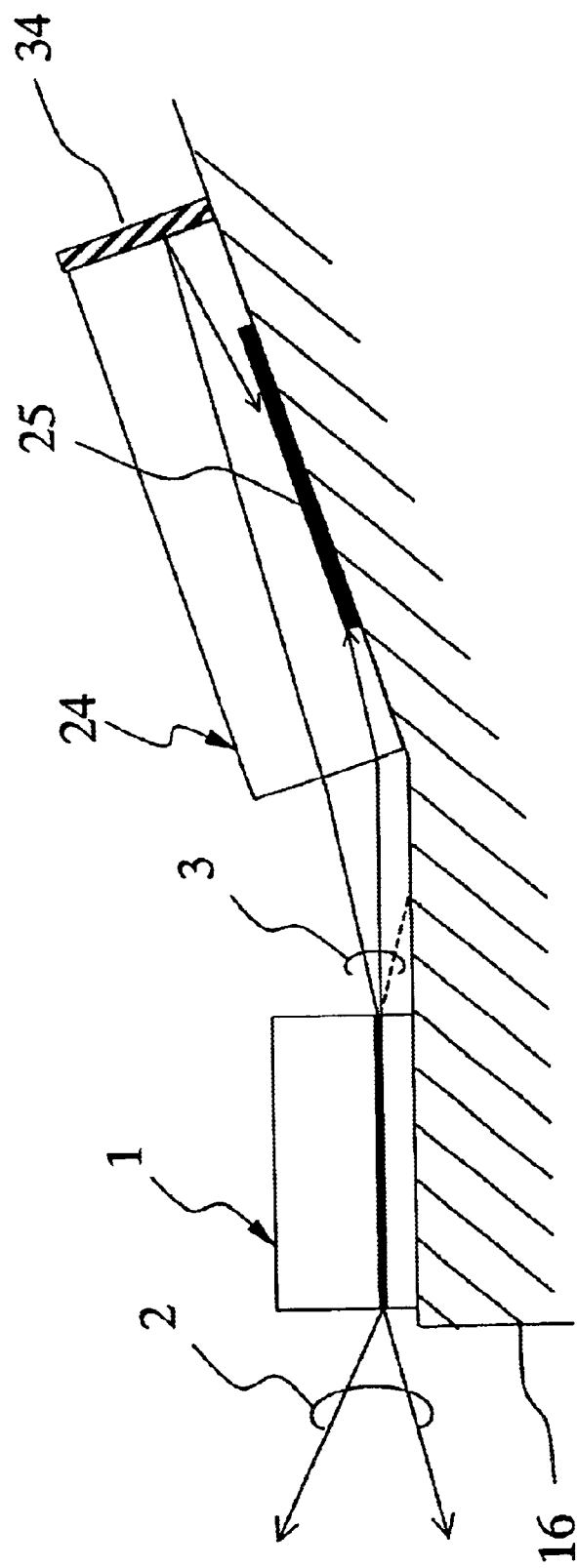

The special feature of the present embodiment is a structure which makes it possible for the monitoring light detector inside the optical transmitter to efficiently detect the backward light from the laser diode by covering the rear end side surface of the monitoring light detector with a reflecting film. FIGS. 10(a) and 10(b) show the embodiment of the present invention. A detailed description is given below based on these drawings.

FIG. 10(a) and 10(b) show embodiments in which the rear end side surface of a light detector is covered with a reflecting film. As shown in FIG. 10(a), the backward light 3 from a laser diode 1 provided in a packaging base 15 is incident on a side surface of a light detector 21. The light detector 21 is provided so that a side of a semiconductor substrate 21a is arranged on a side of the packaging base 15. The backward light 3 incident from such side surface propagates inside the light detector 21, and one portion of the backward light 3 is sent to a semiconductor junction plane 22 of the light detector 21, while the other portion of the backward light 3 is sent to a surface 33 facing such side surface. When the facing surface 33 of the light detector 21 is covered with a reflecting film, almost all of the backward light 3 from the laser diode 1 sent to the facing surface 33 is reflected. Then, the backward light 3 is absorbed by the depletion layer of the light detector 21.

Accordingly, in the case where a side surface of the light detector is covered with a reflecting film, because the backward light of the laser diode is almost entirely reflected by such side surface, the backward light from the laser diode can be detected with good efficiency.

The embodiment shown in FIG. 10(b) obtains the same results. As shown in FIG. 10(b), the backward light 3 from a laser diode 1 provided in a packaging base 16 is incident on a side surface of a light detector 24. The light detector 24 is provided so that a semiconductor junction plane 25 is arranged on a side of the packaging base 16. The backward light 3 incident from such side surface propagates inside the light detector 21 roughly parallel to the semiconductor junction plane 25, and one portion of the backward light 3 is sent to the semiconductor junction plane 25 of the light detector 24, while the other portion of the backward light 3 is sent to a surface 34 facing such side surface. When the facing surface 34 of the light detector 24 is covered with a reflecting film, almost all of the backward light 3 from the laser diode 1 sent to the facing surface 34 is reflected. Then the backward light 3 is absorbed by the depletion layer of the light detector 24.

Accordingly, in the case where a side surface of the light detector is covered with a reflecting film, because the backward light of the laser diode is almost entirely reflected by such side surface, the backward light from the laser diode can be detected with good efficiency.

Ninth Embodiment of the Invention

Figure 11A:
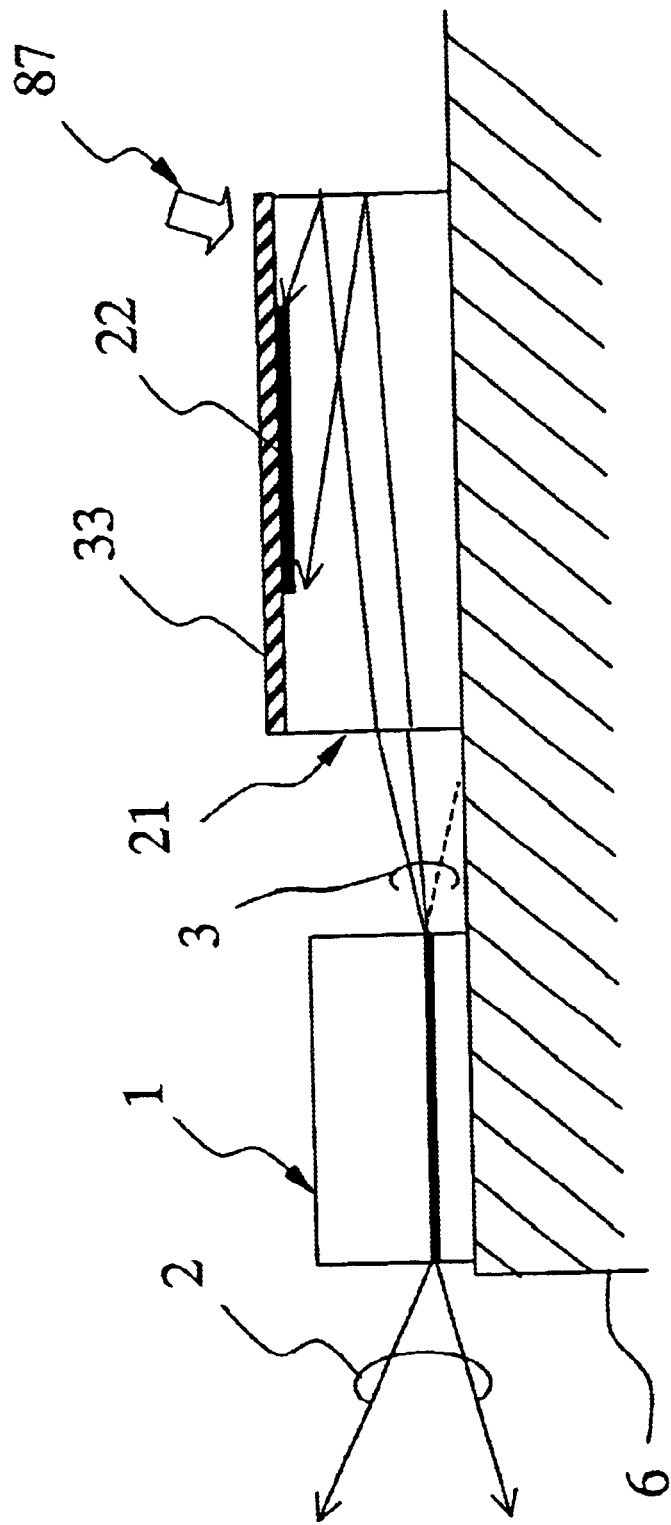
FIGS. 11(a) and 11(b) are cross-sectional schematic explanatory drawings of optical transmitters forming embodiments of the present invention.
Figure 11B:
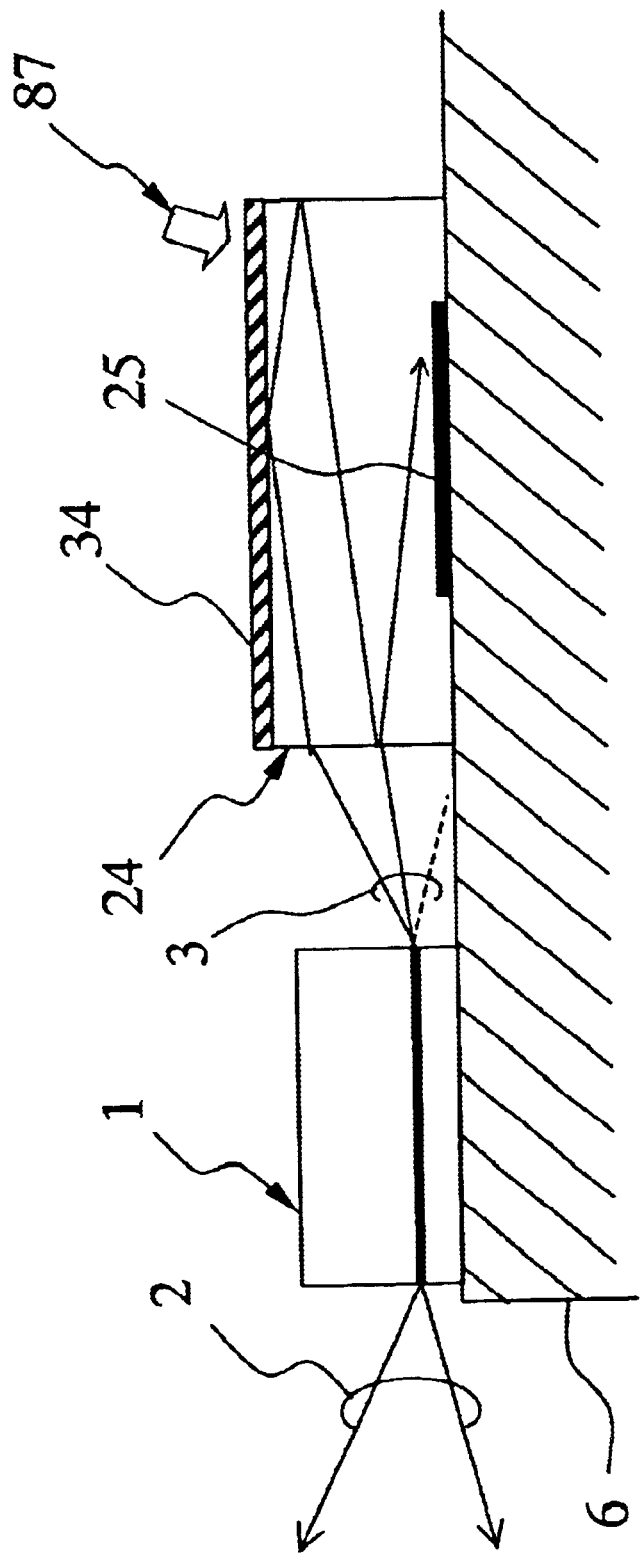

The special feature of the present embodiment is a structure which makes it possible to prevent stray light inside the optical transmitter from entering the monitoring light detector by covering the top surface of the monitoring light detector with a reflecting film. FIGS. 11(a) and 11(b) show the embodiment of the present invention. A detailed description is given below based on these drawings.

FIG. 11(a) shows an embodiment of the present invention. Inside the optical transmitter, output light from the laser diode is reflected by the light detector and the packaging base and forms stray light. In FIG. 11(a), by covering an outside surface 33 of a light detector 21 opposite the side of a packaging base 6 with a reflecting film, it is possible to prevent stray light 87 inside the optical transmitter from entering the light detector 21. FIG. 11(b) shows another embodiment of the present invention. In FIG. 11(b), by covering an outside surface 34 of a light detector 24 opposite the side of the packaging base 6 with a reflecting film, it is possible to prevent the stray light 87 inside the optical transmitter from entering the light detector 24. In order to prevent stray light from entering the light detector, instead of just the outside surface of the light detector opposite the side of the packaging base, by covering all or a portion of the outside surfaces of the light detector excluding the side surface where the backward light 3 from the laser diode 1 is incident with a reflecting film, it becomes possible to obtain even higher results.

Accordingly, by covering all or a portion of the outside surfaces of the light detector with a reflecting film, stray light inside the optical transmitter is prevented from entering the monitoring light detector, and this makes it possible to create a stable negative feedback loop.

Figure 12A:
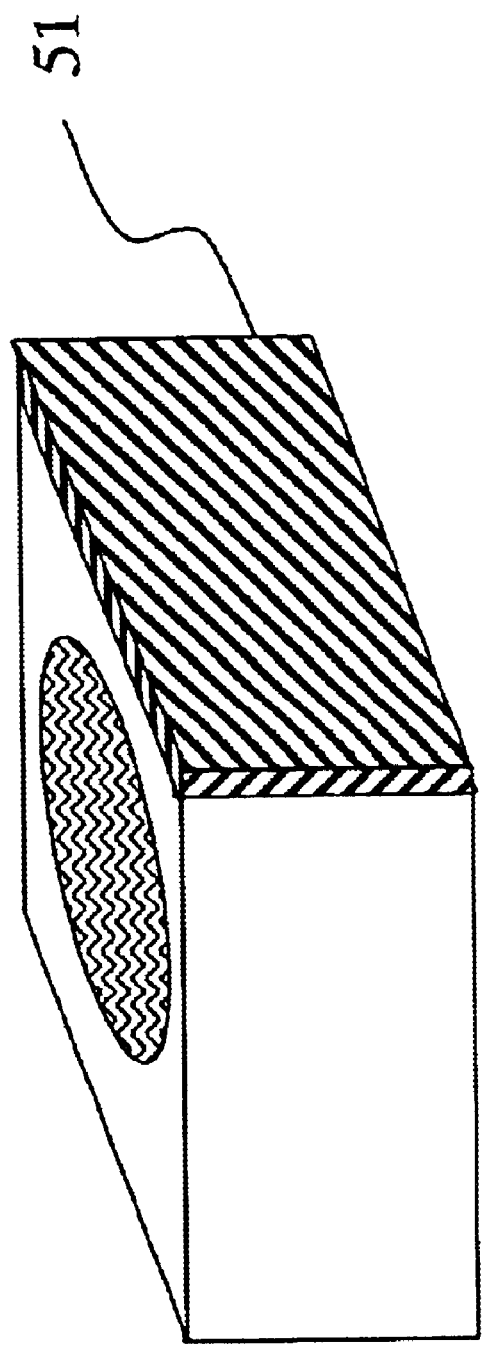
FIGS. 12(a) and 12(b) are schematic explanatory drawings for describing methods of forming a reflecting film on a light detector in order to achieve the present invention.
Figure 12B:
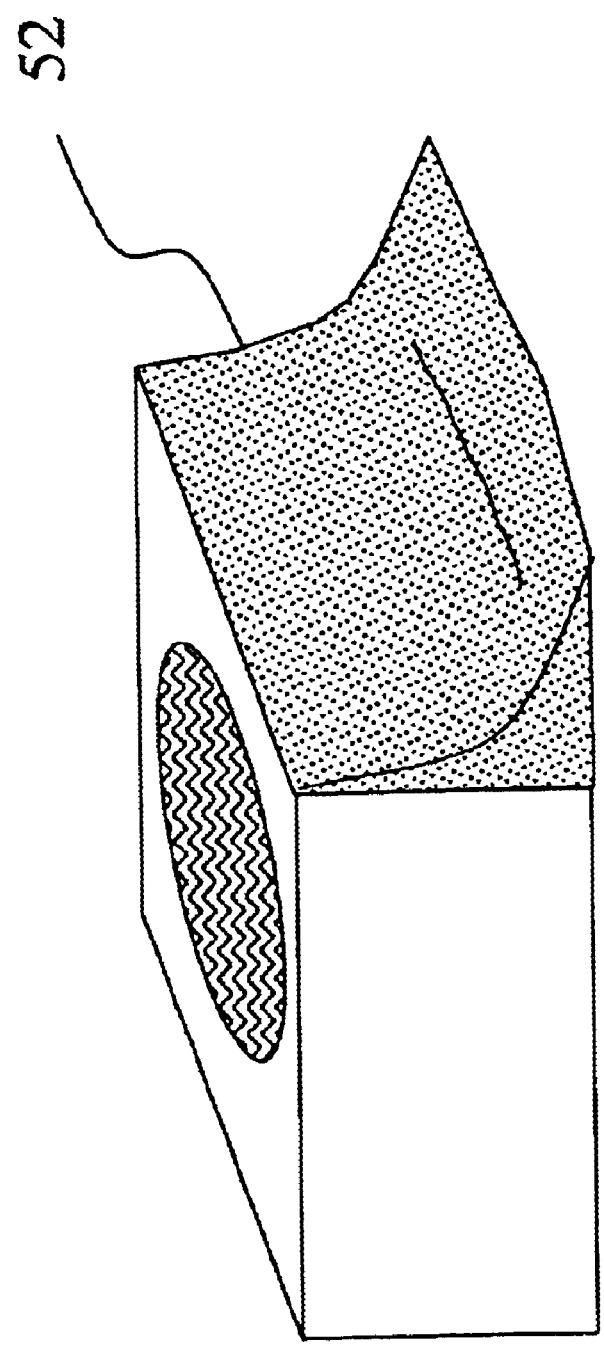

FIGS. 12(a) and 12(b) show methods of covering the light detector with the reflecting film described in the embodiments up to this point.

As shown in FIG. 12(a), a reflecting film 51 which covers an outside surface of a light detector is obtained by bonding a metal to the outside surface of the light detector using a vapor deposition method, a sputtering method or an ion plating method. As for the metal, it is possible to apply Al, $Al_2O_3$, Au, Ag or the like. Further, the same results can be obtained with $SiO_2$.

Furthermore, it is possible to form the reflecting film by a dielectric multilayer film.

As shown in FIG. 12(b), it is possible to form the reflecting film on the outside surface of the light detector by bonding a metal paste 52 such as a silver paste in which silver is added to a binder or the like to the surface of the light detector.

What is claimed is:

1. An optical transmitter, comprising:
    a laser diode and a light detector provided on substrate base, said light detector having a semiconductor junction plane, and a front end side surface which is approximately orthogonal to said semiconductor junction plane;
    wherein said light detector is inclined so as to send an output light from said laser diode incident from said front end side surface to said semiconductor junction plane of said light detector wherein said substrate base of said laser diode and said light detector comprises a convex substrate base with two levels thereby sending a beam center line of said output light from said laser diode incident from said front end side surface to said semiconductor junction plane.

2. The optical transmitter described in claim 1, wherein a reflecting film is formed on all or a portion of outside surfaces of said light detector excluding said front end side surface where said output light from said laser diode is incident.

* * * * *